United States Patent
Kawai

(10) Patent No.: US 6,469,396 B1
(45) Date of Patent: Oct. 22, 2002

(54) INTEGRATED CIRCUIT CHIP HAVING INPUT/OUTPUT TERMINALS FOR TESTING AND OPERATION

(75) Inventor: Eiji Kawai, Tokyo (JP)

(73) Assignee: Sony Computer Entertaiment, Inc. (JP)

( * ) Notice: Subject to any disclaimer, the term of this patent is extended or adjusted under 35 U.S.C. 154(b) by 0 days.

(21) Appl. No.: 09/442,700

(22) Filed: Nov. 18, 1999

(30) Foreign Application Priority Data

Nov. 20, 1998 (JP) .......................... 10-331384

(51) Int. Cl.[7] .................. H01L 27/08; H01L 23/48; H01L 23/52; H01L 27/10
(52) U.S. Cl. .............. 257/784; 257/690; 257/777; 257/723; 257/783; 257/666; 257/786; 257/685; 257/686; 257/692; 257/693; 257/208; 257/207; 257/203; 257/48
(58) Field of Search .................. 257/666, 668, 257/690–693, 723, 686, 685, 777, 784, 786, 783, 207, 203, 208, 48

(56) References Cited

U.S. PATENT DOCUMENTS

| | | | | |
|---|---|---|---|---|
| 4,386,389 A | * | 5/1983 | Proebsting | 361/406 |
| 4,220,917 A | * | 9/1990 | McMahon et al. | 324/51 |
| 5,453,991 A | * | 9/1995 | Suzuki et al. | 371/22.1 |
| 5,646,422 A | * | 7/1997 | Hashizume | 257/48 |
| 5,949,139 A | * | 9/1999 | Imura et al. | 257/723 |
| 5,969,538 A | * | 10/1999 | Whetsel | 324/763 |
| 2001/0026008 A1 | * | 10/2001 | Tsuneda et al. | 257/668 |

FOREIGN PATENT DOCUMENTS

| | | |
|---|---|---|
| JP | 62-62552 | 3/1987 |
| JP | 1-198051 | 8/1989 |
| JP | 7-122701 | 5/1995 |
| JP | 11-8277 | 1/1999 |

* cited by examiner

Primary Examiner—Alexander O. Williams
(74) Attorney, Agent, or Firm—Lerner, David, Littenberg, Krumholz & Mentlik, LLP

(57) ABSTRACT

An integrated circuit chip consists of, a substrate having edges defining an inner area; circuit modules located on the substrate; and input/output terminals for inputting and outputting one or more signals to and from the circuit modules. The input/output terminals include (i) input/output terminals used for operation, which input/output one or more operation signals during operation of the circuit modules, and (ii) input/output terminals used for inspection of the circuit modules. The input/output terminals used for operation are arranged along the edges of the substrate, and the circuit modules and the input/output terminals used for inspection are arranged on the inner area of the substrate.

8 Claims, 10 Drawing Sheets

3A – 3A CROSS-SECTIONAL VIEW

3B – 3B CROSS-SECTIONAL VIEW 8-8 CROSS-SECTIONAL VIEW (COMPARATIVE EXAMPLE)

INTEGRATED CIRCUIT CHIP HAVING INPUT/OUTPUT TERMINALS FOR TESTING AND OPERATION

BACKGROUND OF THE INVENTION

1. Technical Field of the Invention

This invention relates to an integrated circuit chip in which a plurality of circuit modules are integrated, an integrated circuit element with the integrated circuit chip packaged therein, and an electronic device with the integrated circuit element mounted therein.

2. Related Art

Recently, in the integrated circuit field, a design rule for fabrication of a semiconductor has become finer and a circuit scale which can be integrated per unit area increases as the techniques for semiconductor fabrication progresses. Therefore, the size of an integrated circuit chip can be reduced as compared with before, if the circuit scale is the same. On the other hand, a width of a data bus of a digital signal processing circuit in the integrated circuit has increased as compared with before. Due to the synergy of the increase of the integration density and enlargement of the data bus width, the number of the input/output (I/O) terminals necessary for inputting/outputting a signal between the integrated circuit in the chip and external equipment increases more and more. Conventionally, the I/O terminals are arranged in a row along edges of the chip. For example, when the chip is square, the terminals are arranged on four sides of the square without leaving a gap between each of the terminals. The I/O terminals each usually have a bonding pad and a buffer circuit. The buffer circuit functions to protect circuit modules in the chip from external noises and it ordinarily comprises a transistor having a relatively large capacitance.

The integrated circuit chip is mounted on the printed circuit board of an electronic device by either of two methods.

One method is such that the integrated circuit chip is encapsulated in a package of a resin to form an integrated circuit element and the integrated circuit element is mounted on a printed circuit board. In this case, bonding pads of the I/O terminals in the chip are connected to terminals of the package for external connection by wire bonding and the connected portions are sealed in the package. When the terminals for external connection are connected to the printed circuit board, the integrated circuit chip and the printed circuit board are connected each other. According to this method, the circuit modules on the chip are protected by the package, which enhances reliability.

Another method is a so-called direct bonding method where a chip is directly bonded on a printed circuit board. Since the chip is directly wire-bonded on the printed circuit board in the form a of so-called bare chip, without being encapsulated in a package, a space needed for arranging the integrated circuit chip on the printed circuit board is reduced by a space corresponding to that which a package would have taken. In addition, advantageously, the cost of the package can also be saved.

As mentioned above, although the circuit modules in the chip are reduced in size as the semiconductor fabrication process becomes finer, a pitch of the I/O terminals does not reduce as much. This is so because there is a limit to the amount by which an interval between wires or between a wire and an adjacent lead during wire bonding may be reduced while still avoiding an electrical short circuit between wires adjacent to each other or an electrical short circuit between a wire and an adjacent lead.

Thus, even if the chip size is determined from the view point of the scale of the circuit modules in the chip, a peripheral length of the chip is not large enough for arranging the I/O terminals along the length. For this reason, the chip size should be determined based on the number of the I/O terminals (a phenomenon known as "pad neck" which occurs when it is not possible to further reduce a chip size due to the number of I/O terminals). In a "pad necked" chip, the chip size is larger than necessary for the scale of the circuit modules in the chip and, therefore, a vacant area where no circuit modules are disposed is present. The vacant area is located in an inner area of the chip, while the I/O terminals are disposed around the periphery of the chip without a gap between each of the terminals.

If the chip size is larger than necessary for the circuit modules, the chip cost is correspondingly high.

OBJECTS OF THE INVENTION

The present invention is made in view of the facts as mentioned above, and it is an object of the present invention to provide an integrated circuit chip which is capable of avoiding pad necking and has an optimum size for its circuit scale.

SUMMARY OF THE INVENTION

According to the invention, there is provided an integrated circuit chip comprising a substrate, circuit modules formed on the substrate, and input/output terminals for inputting/outputting a signal to/from the circuit modules;

the input/output terminals including input/output terminals for operation time which input/output a signal during operation of the circuit modules and input/output terminals for inspection which inspect the circuit modules; and the input/output terminals for operation time being arranged on the substrate along edges of the substrate and the input/output terminals for inspection and the circuit modules being arranged on the substrate in an inner area than the input/output terminals for operation time.

PREFERRED EMBODIMENT OF THE PRESENT INVENTION

Preferred embodiments of the present invention will now be described.

An integrated circuit chip 10 and an integrated circuit element 20 with the integrated circuit chip packaged therein in accordance with a first embodiment of the present invention will be described referring to FIGS. 1, 2, 3A and 3B.

Figure 1:
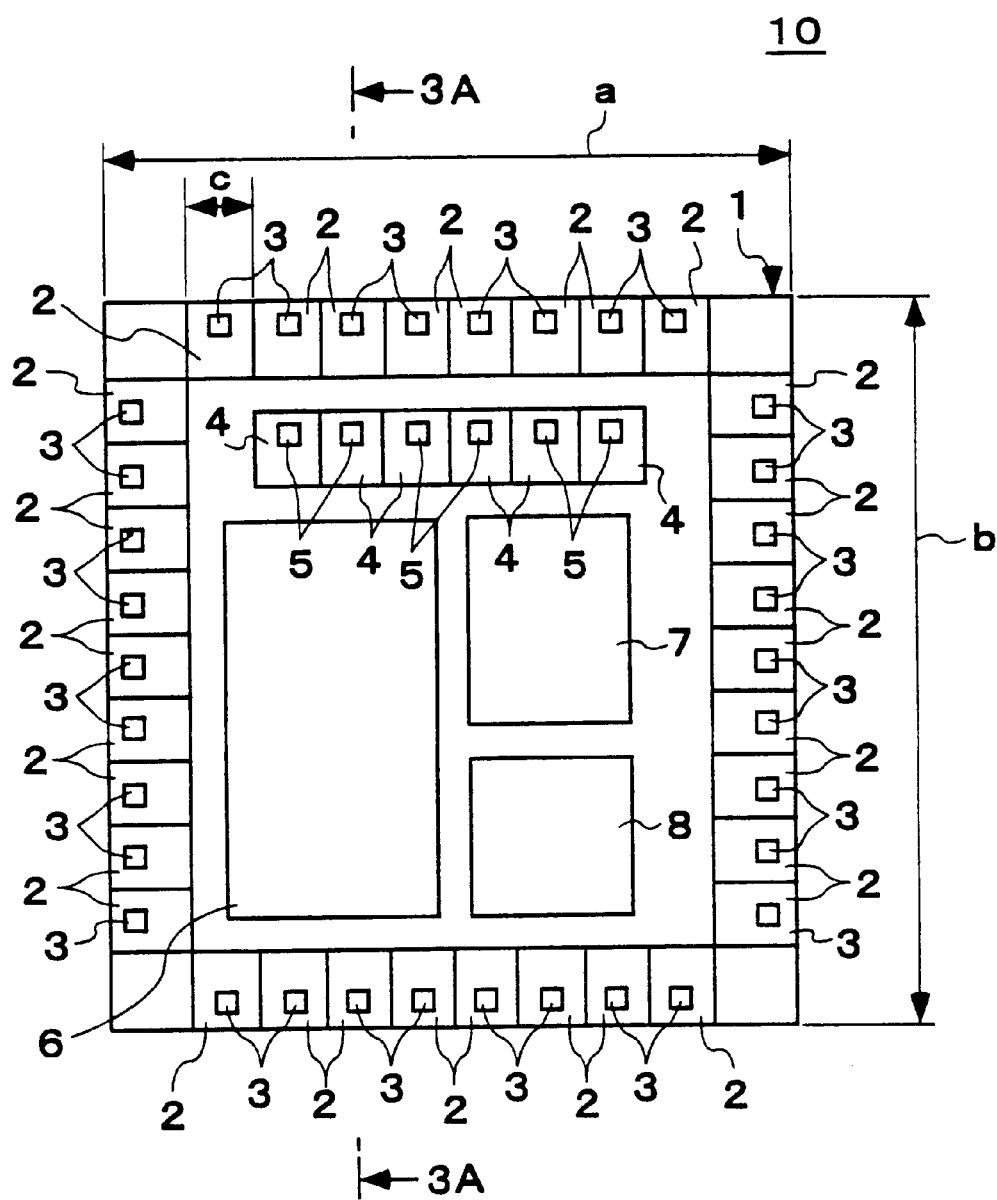
FIG. 1 is a top plan view showing a structure of an integrated circuit chip 10 according to a first embodiment of the present invention.
Figure 3A:
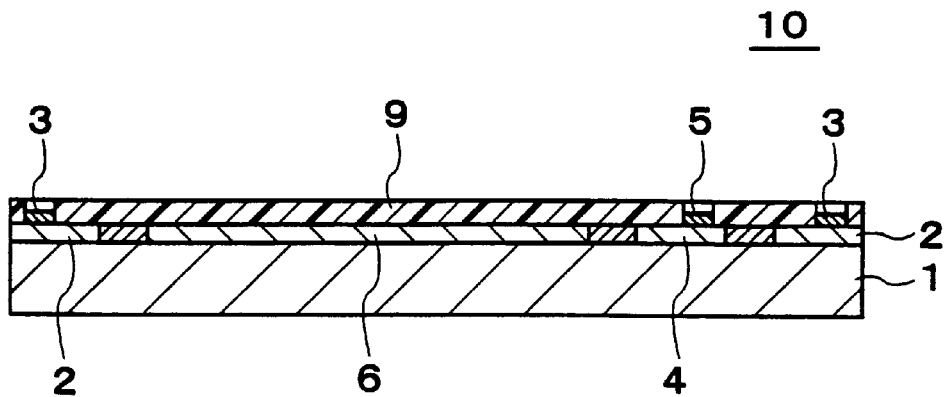
FIG. 3A is a sectional view of the integrated circuit chip 10, taken along a line 3A—3A of FIG. 1.

As shown in FIGS. 1 and 3A, the integrated circuit chip 10 comprises a semiconductor substrate 1 of a square shape having a lateral length a, a longitudinal length b and thirty four (34) I/O terminals 2 which are arranged at a pitch c on four sides of the substrate 1 without leaving a gap between each of the I/O terminals 2. In an inner area of the substrate 1 which is surrounded by the I/O terminals 2, are disposed circuit modules 6, 7 and 8 and six (6) I/O terminals 4.

The I/O terminals 2 are electrically connected to wirings on a printed circuit board through bonding wires and leads when the chip 10 is mounted on the printed circuit board. The I/O terminals 2 function as user I/O terminals (or I/O terminals used for operation) for carrying out inputting or outputting one or more signals when the circuit modules 6, 7 and/or 8 are operated. On the other hand, the I/O terminals 4 are irrelevant to functions or specifications of the integrated circuit chip 10 from a view point of the users. These terminals 4 are not used when the circuit modules 6, 7 and/or 8 of the mounted circuit chip 10 are in normal operation. The I/O terminals 4 are used, for example, as terminals for inspection, e.g., when one or more signals are inputted or outputted for inspecting whether the circuit modules 6, 7 and 8 are in a normal condition for operation. This inspection is usually done during the fabrication of the chip 10 or prior to the shipping thereof, e.g., when producing conditions of film forming or etching during the fabrication of the integrated circuit chips 10 are checked or when they are used as terminals for repair or BIST (Built-In Self Test)/BISR (Built-In Self repair). Hereinafter, the I/O terminals 4 may also be referred to as I/O terminals used for testing.

The I/O terminals 2 each comprise a bonding pad 3 for wire bonding and a buffer circuit (not shown) for connecting the bonding pad 3 to the circuit modules 6, 7 and 8. The I/O terminals 4 each comprise a probe pad 5 for contact with a probe for testing and a buffer circuit (not shown) for connecting the probe pad 5 to the circuit modules 6, 7 and 8. The buffer circuits of the I/O terminals 2 and 4 include transistors and function to protect the circuit modules 6, 7 and 8 from external noise signals.

An upper face of the chip 10 is covered with a protective film 9 of resin which is omitted in FIG. 1 for simplicity of illustration, but is shown in FIG. 3A. The protective film 9 has through holes at positions corresponding to the bonding pads 3 and the probe pads 5 such that the upper surfaces of the bonding pads 3 and the probe pads 5 are exposed.

Figure 2:
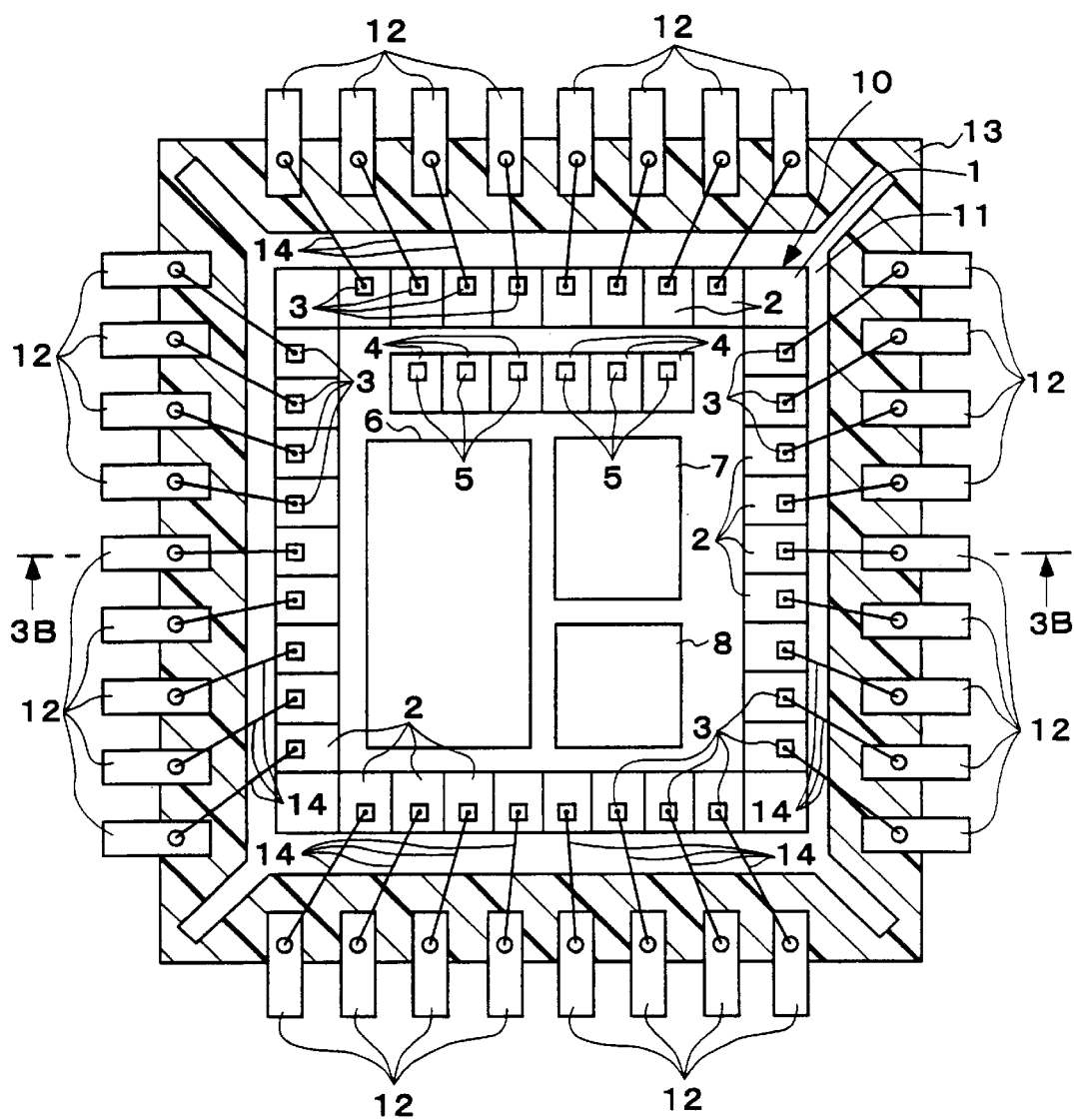
FIG. 2 is a sectional view showing a structure of an integrated circuit element 20 with the integrated circuit chip 10 of FIG. 1 packaged therein.
Figure 3B:
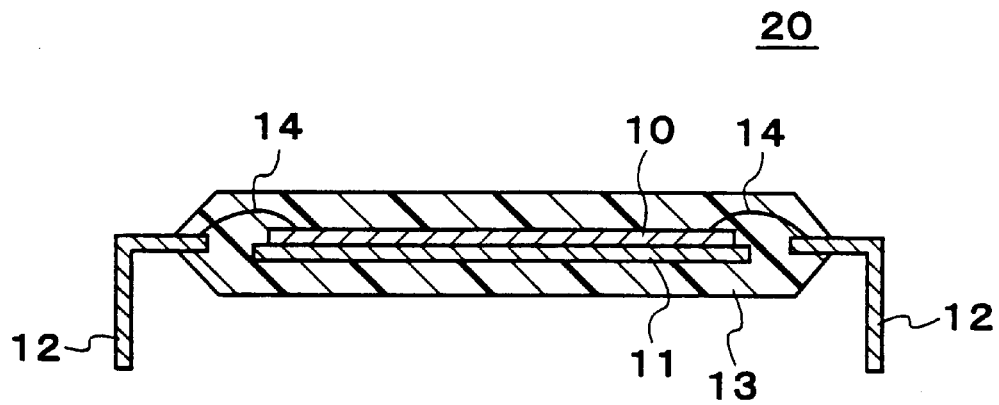
FIG. 3B is a sectional view of the integrated circuit element 20, taken along a line 3B—3B of FIG. 2.

The integrated circuit element 20 with the chip 10 packaged therein will now be described with reference to FIGS. 2 and 3B.

The integrated circuit element 20 comprises the chip 10, an island 11 for mounting the chip thereon, leads 12 and a package 13 (e.g., resin) for encapsulating these elements therein. The leads 12 are each connected to the bonding pads 3 of the I/O terminals 2 by wires 14, respectively.

The pads 5 of the I/O terminals 4 are not connected to the leads 12 because the I/O terminals 4 are used only for testing as mentioned above and there is no need to connect to the wirings of the printed circuit board.

The fabrication method of the chip 10 and the integrated circuit element 20 is now described.

First, the circuit formation of the circuit modules 6, 7 and 8 and the I/O terminals 2 and 4, and the layout on the substrate 1 are designed. At this time, the I/O terminals necessary for the chip 10 are divided into the I/O terminals 2 (which are to be connected to the printed circuit board after mounting) and the I/O terminals 4 (which are used for testing and need not be connected to the printed circuit board). Then, the I/O terminals 2 are laid out so that the terminals 2 are arranged in a row (or rows) around the substrate 1 without gaps between each of the terminals 2 as illustrated in FIG. 1. The circuit modules 6, 7 and 8 and the I/O terminals 4 are designed so that they are disposed in an inner area surrounded by the I/O terminals 2. The size of the substrate 1 (in this example) is determined to be minimum, a×b.

A semiconductor wafer is used as the substrate 1 and semiconductor fabricating techniques (such as film formation, diffusion and/or photolithography) are employed to form the circuit modules 6, 7 and 8 and the I/O terminals 2 and 4 on the substrate 1. Then, the semiconductor wafer is diced to obtain the substrate 1 having a size of a×b. Thus, the chip 10 is provided.

Figure 4:
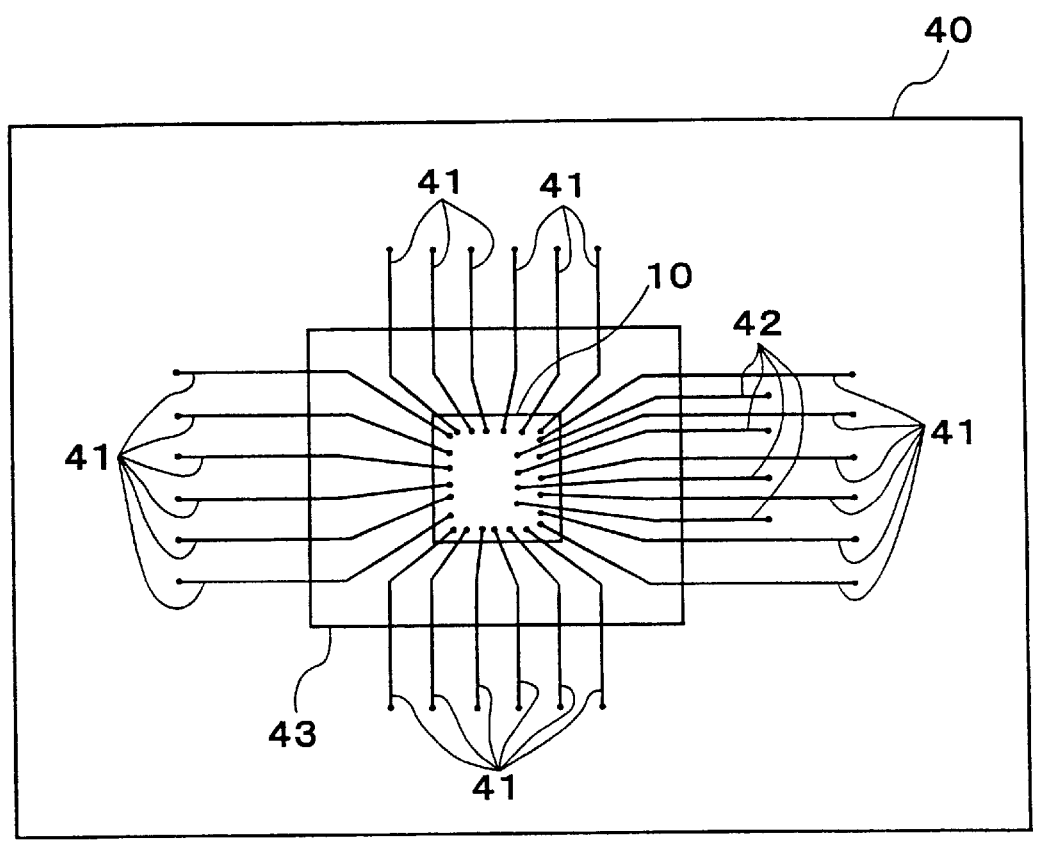
FIG. 4 is a top plan view showing a structure of a probe card 40 to be used during the fabrication of the integrated circuit chip 10 according to the first embodiment of the present invention.
Figure 5:
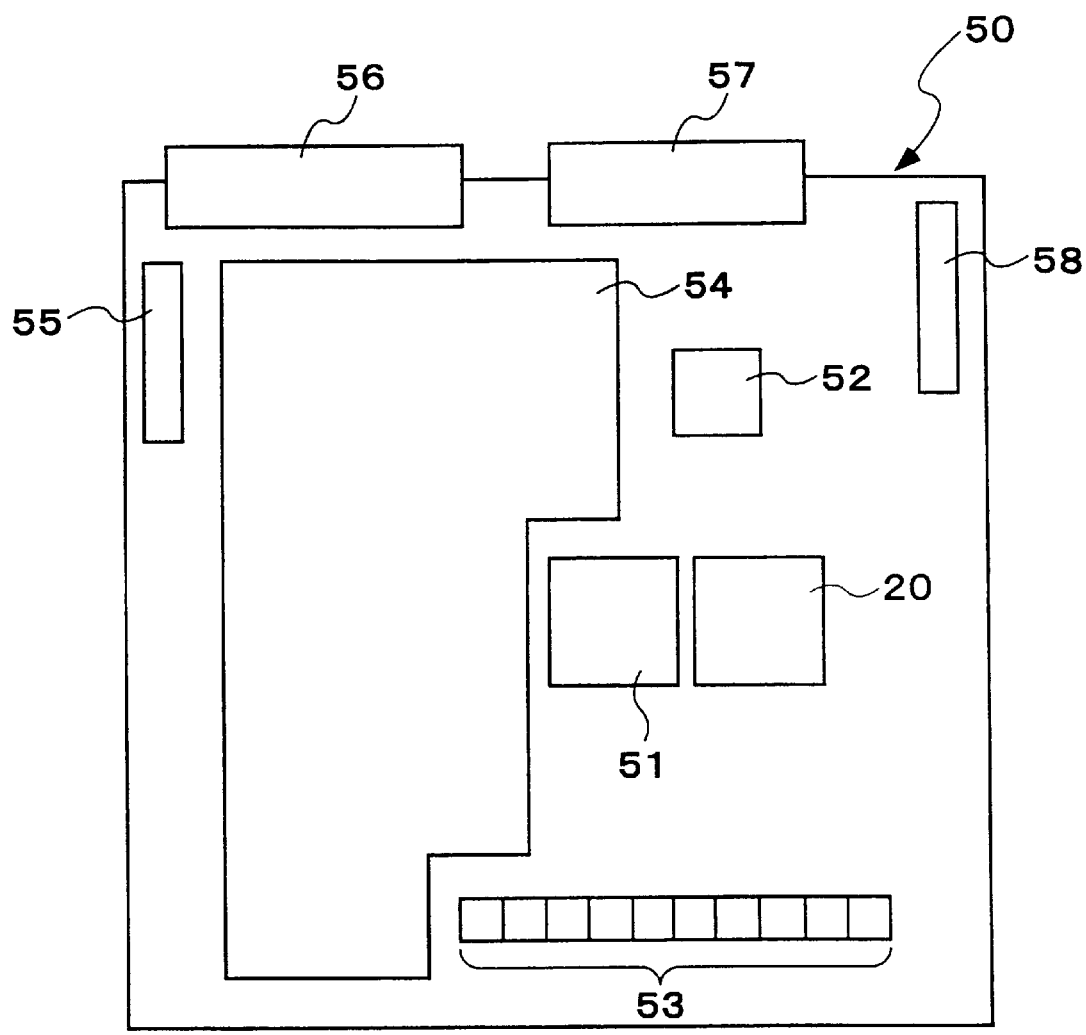
FIG. 5 is a top plan view showing a structure of a printed circuit board 50 with the integrated circuit element 20 mounted thereon.

Before or after the dicing, a test is conducted using a probe card 40 as illustrated in FIG. 4 for checking the operations of the circuit modules 6, 7 and 8.

The probe card 40 has an opening 43 at a central portion thereof and probes 41 and 42 which are set around the opening 43. It is noted that the probes 41 and 42 are not shown in full detail for simplicity of illustration. The number of probes 41 is the same as the number of I/O terminals 2 and the number of probes 42 is the same as the number of I/O terminals 4. The tip ends of the probes 41 and 42 converge towards the area at the central position of the opening 43 where the chip 10 is to be placed. The tip ends of the probes 41 are so disposed at predetermined intervals that they may contact the respective bonding pads 3 of the I/O terminals 2. Similarly the tip ends of the probes 42 are disposed so as to contact the respective probe pads 5 of the I/O terminals 4.

With this construction, the semiconductor wafer (before dicing) and the chip 10 (after dicing) may be placed at the central portion of the opening 43 of the probe card 40. The probes 41 and 42 may then contact the bonding pads 3 and the probe pads 5, respectively, for allowing signals to be inputted or outputted from or to an external circuit through the probes 41 and 42. Thus, the test of the circuit modules 6, 7 and 8 and the test of the fabrication conditions (i.e., whether the film forming or etching is being carried out as designed) can be performed.

Thereafter, the chip 10 is subjected to packaging. First, the chip 10 is die-bonded onto the island 11 of a lead frame. The bonding pads 3 of the I/O terminals 2 are bonded at connection portions to the leads 12 of the lead frame through wires 14 (FIG. 2). The probe pads 5 of the I/O terminals 4 are not bonded. Then, the chip 10 and connection portions of the leads 12 are encapsulated with the resin package 13. The leads 12 and the island 11 are cut off from the lead frame, and the leads 12 are bent to produce the integrated circuit element 20.

As mentioned above, the chip 10 is so constructed that the I/O terminals are divided into the I/O terminals 2 (for operation) and the I/O terminals 4 (for testing), where only the I/O terminals 2 are arranged around the periphery of the chip 10. This construction allows the chip size to be reduced as compared with conventional chips in which all the I/O terminals are arranged around the periphery of the chip. Further, the number of I/O terminals which should be bonded is reduced and, therefore, the time necessary for bonding is also reduced. Thus, the fabrication efficiency is improved. On the other hand, in cases where the size of the chip 10 is conventional, the I/O terminals 2 can be arranged leaving margins (e.g., spaces) between adjacent I/O terminals 2. The spaces may correspond with the number of I/O terminals not arranged around the periphery of the chip 10. As a result, the spaces between the bonding wires 14 and the spaces between the bonding wires 14 and the respective adjacent leads 12 can be easily achieved. Thus, it is possible to reduce the incidence of defects.

As the integrated circuit element 20 (which packages the chip 10 of the present invention) can be small-sized by an amount corresponding to the reduction in the size of the chip 10, the area that the integrated circuit element 20 occupies on the printed circuit board is reduced. Thus, the mounting efficiency is improved. On the other hand, if the size of the chip 10 is conventional, the spaces between the leads 12 can be broader because the number of I/O terminals 2 to be arranged around the periphery of the chip 10 is smaller than the number of I/O terminals in a conventional chip. In this case, an advantage is achieved in that the incidence of rejects due to possible short-circuiting between adjacent leads 12 during soldering can be reduced.

Comparative examples will now be described referring to FIGS. 9A and 9B and FIGS. 10A and 10B. As shown, chips 90 and 91 have both I/O terminals 2 and 4 arranged around the periphery of the substrate 1.

Figure 9A:
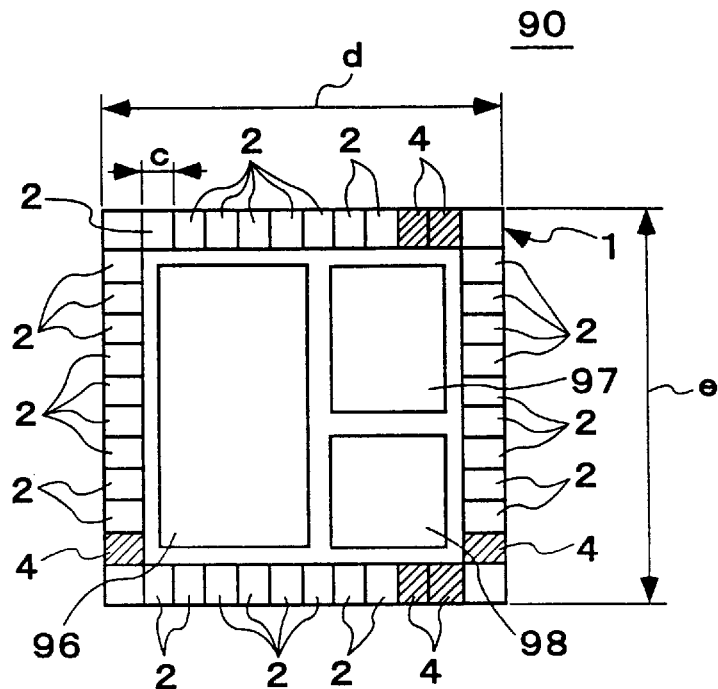
FIG. 9A is an explanatory view showing a structure of an integrated circuit chip 90 of a comparative example.
Figure 9B:
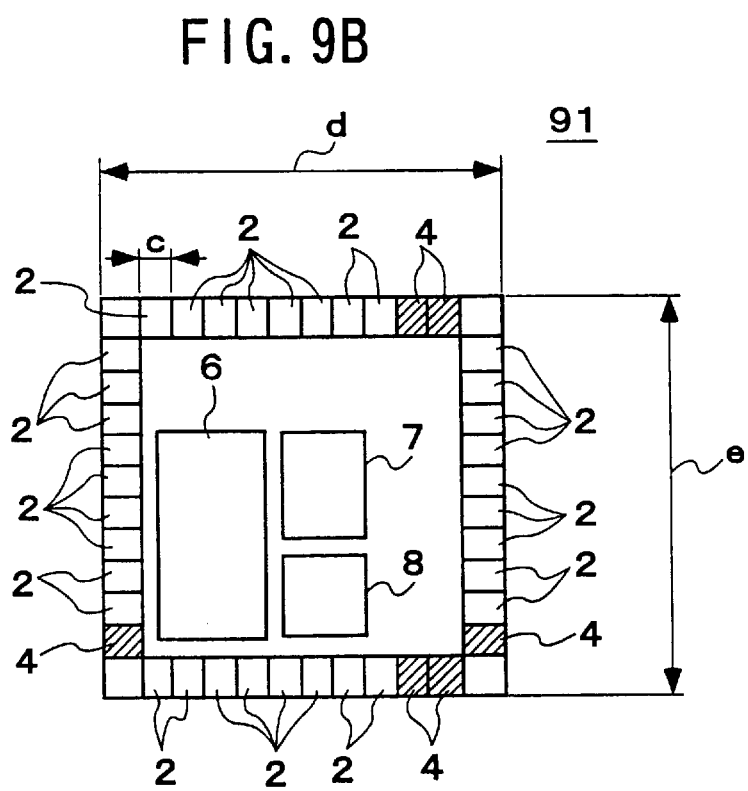
FIG. 9B is an explanatory view showing a structure of an integrated circuit chip 91.
Figure 10A:
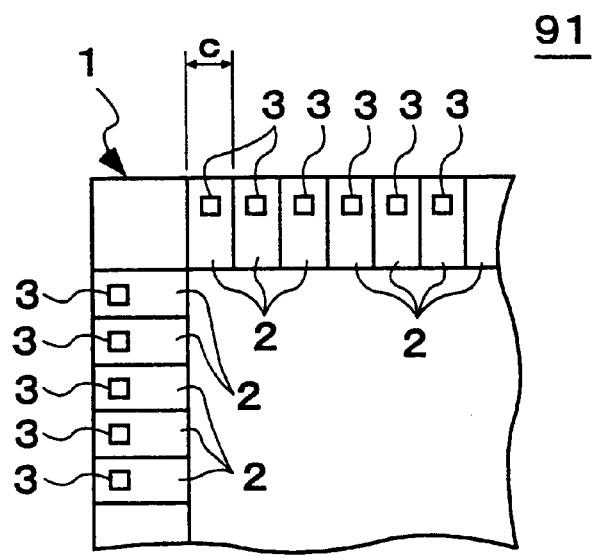
FIG. 10A is an explanatory view showing arrangement of I/O terminals 2 of the integrated circuit chip 91 of the comparative example.
Figure 10B:
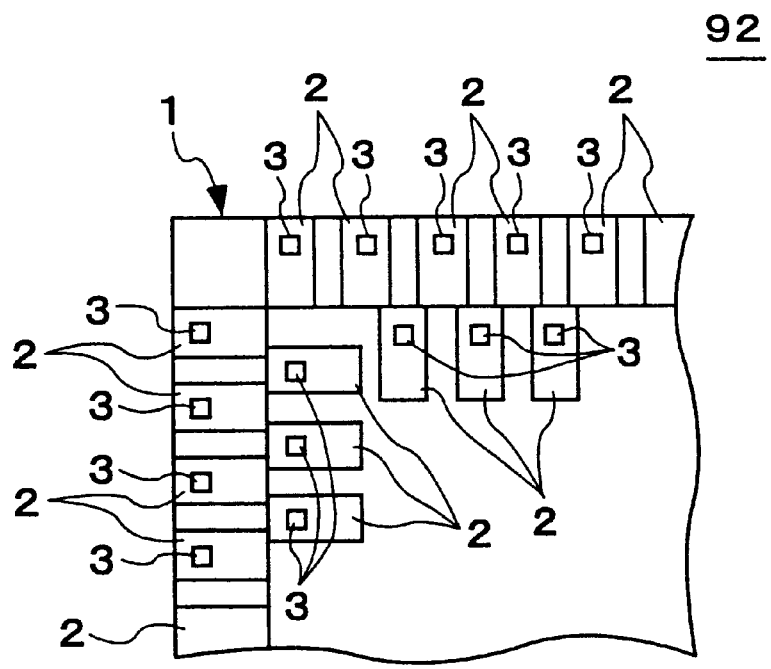
FIG. 10B is an explanatory view showing arrangement of I/O terminals of the integrated circuit chip 92 of the comparative example.

In the chip 90 of the comparative example, thirty four (34) I/O terminals 2 (for operation) and six (6) I/O terminals 4 (for testing) totally forty (40) are all arranged in row around the periphery of the substrate 1. The I/O terminals 2 each have a bonding pad 3 as illustrated in FIGS. 10A and 10B and the I/O terminals 4 each have a probe pad 5 (not shown). The pitch c of the I/O terminals 2 and 4 as shown in FIGS. 9A and 9B is the same as the pitch c of the I/O terminals 2 of the above-mentioned embodiment as illustrated in FIG. 1. However, the number of the I/O terminals arranged around the periphery of the substrate in FIGS. 9A and 9B is larger (as compared to FIG. 1) by the number of the I/O terminals 4 for testing and, accordingly, the lengths d and e of the sides of the substrate 1 are longer than a and b of the substrate 1 in FIG. 1, respectively.

Circuit modules 96, 97 and 98 each have a circuit constitution substantially the same as those of the circuit modules 6, 7 and 8, but they are designed according to the design rule rougher than that for the circuit modules 6, 7 and 8. As a result of this, the circuit modules 96, 97 and 98 occupy larger spaces on the substrate. Therefore, the area surrounded by the I/O terminals 2 and 4 is substantially occupied by the circuit modules 96, 97 and 98.

It is noted that in the case where the I/O terminals 2 and the I/O terminals 4 are arranged in a mixed fashion, as in the chip 90 of the comparative example, the bonding pads 3 of the I/O terminals 2 and the probe pads 5 of the I/O terminals 4 are bonded because a bonding machine cannot determine not to bond the probe pads 5 of the I/O terminals 4. Thus, as many as 40 leads 12 in total, corresponding to the number of I/O terminals 2 and 4, are necessary for packaging.

Next, the design rule for the circuit modules 96, 97 and 98 of the chip 90 of the comparative example is changed to a fine design rule used for the embodiment of the present invention to obtain a chip 91 of another comparative example (FIG. 9B). The circuit modules 6, 7 and 8 of the chip 91 are reduced by 0.7 in the longitudinal direction, and the area occupied on the substrate 1 by the circuit modules 6, 7 and 8 is reduced to ½ of that of the circuit modules 96, 97 and 98. As a result, there remains an unoccupied space in the interior region of the substrate 1 as can be seen in FIG. 9B.

However, in the chip 91, the pitches of the I/O terminals 2 and 4 cannot be smaller than c in order to keep the predetermined intervals between the bonding wires. For this reason, the lengths of the sides of the substrate 1 of the chip 91 cannot be smaller than d and e for all the unoccupied space in the inner region. Thus, the chip 91 cannot be smaller than the chip 90 of the comparative example (FIG. 9A) irrespective of the application of the fine design rule. A so-called "pad neck" problem is thus caused in which the number of the I/O terminals 2 and 4 determines the size of the substrate 1.

To avoid the "pad neck" problem, a chip 92 may be contemplated as a comparative example in which I/O terminals 2 are arranged zigzagged in two rows around the periphery of the substrate 1 as illustrated in FIG. 10B. By arranging the I/O terminals in two rows, the inner area of the substrate 1 can be well utilized and, therefore, if the size of the substrate is not changed, the number of the I/O terminals can be increased up to 1.5 times.

However, when the I/O terminals 2 are arranged zigzaggedy, bonding wires connected to the outer row of the I/O terminals 2 should be spaced by at least a predetermined distance from bonding wires connected to the inner row of the I/O terminals 2. For this reason, it is required that the space between the outer row of the I/O terminals 2 be broadened and the inner row of the I/O terminals 2 be positioned between each of the outer row I/O terminals as shown in FIG. 10B. In addition, there is a strict restriction in that the positions of the pads 3 of the inner row I/O terminals 2 be close to the outer row I/O terminals 2 because the existing bonding machine cannot carry out bonding if the positions of the pads 3 of the inner I/O terminals 2 are distant from the edges of the substrate 1. This makes the design for optimum arrangement of the I/O terminals 2 very complicated.

In comparison with the chips 90, 91 and 92 of the comparative examples, the chip 10 of the present invention as described above can be provided by dividing the I/O terminals into the I/O terminals 2 (for operation) and the I/O terminals 4 (for testing) and arranging the I/O terminals 4 for testing in the inner unoccupied space of the substrate 1. Further, the I/O terminals 4 (for testing) may be placed at any unoccupied area distant from the edge of the substrate 1 as long as the measurement by using the probe card 40 can be made, because the I/O terminals 4 for testing are not necessary to be bonded. Thus, there is a very large freedom in design. Actually, the design of the chip 10 is very easy and the size of the chip 10 can be reduced overcoming the "pad neck" problem. Further, as the number of the bonding occurrences can be reduced, the bonding itself can be effected easily, which directly reduces cost.

The chip 10 according to the present embodiment requires no reduction in the number of I/O terminals 4 for testing and also permits an increase in the number of I/O terminals 4 for testing if there remains vacant space in the inner area of the substrate 1. Thus, chip 10 has a sufficient number of I/O terminals 4 for inspecting the operation condition and fabrication condition with respect to the circuit modules 6, 7 and 8. Rejects can be efficiently located and the fabrication conditions can be seen easily. Chips 10 of high quality can therefore be manufactured in high yields.

It should be appreciated that some of the I/O terminals 4 for testing may be arranged around the periphery of the substrate 1 if the size of the substrate permits, although all the I/O terminals 4 for testing are arranged in the inner area of the substrate 1 in the illustrated embodiment. It is noted that any I/O terminals 4 for testing which also function as I/O terminal 2 for operation, or I/O terminals 4 which input or output a test signal through a printed circuit board after the chip has been mounted on the printed circuit board, should be mounted around the periphery of the substrate 1 and bonded.

The number and/or the shape of the I/O terminal 2 for operation and the I/O terminal 4 for testing are not limited to those as illustrated in FIG. 1 and may be changed according to necessity. The shape of the substrate 1 is also not limited to a square as illustrated in FIG. 1.

A printed circuit board 50 on which the integrated circuit element 20 of the first embodiment is mounted and an electronic device 100 on which the printed circuit board is mounted will now be described as a second embodiment referring to FIGS. 5 to 8.

On the printed circuit board 50 are mounted the integrated circuit element 20 of the first embodiment and integrated circuit elements 51, 52 and 53 by soldering. The chip 10 of the integrated circuit element 20 is provided with a circuit which functions as a main processor of the electronic device 100. The Main processor may be in the form of the circuit modules 6, 7 and 8. The integrated circuit element 51, the integrated circuit element 52 and the integrated circuit element 53, are provided in the form of circuit modules, a circuit dedicated for image processing, an input/output controlling circuit and a memory circuit, respectively. On the printed circuit board 50, there are further mounted a circuit element 54, connectors 55, 56, 57 and 58 and wirings (not shown).

Figure 6:
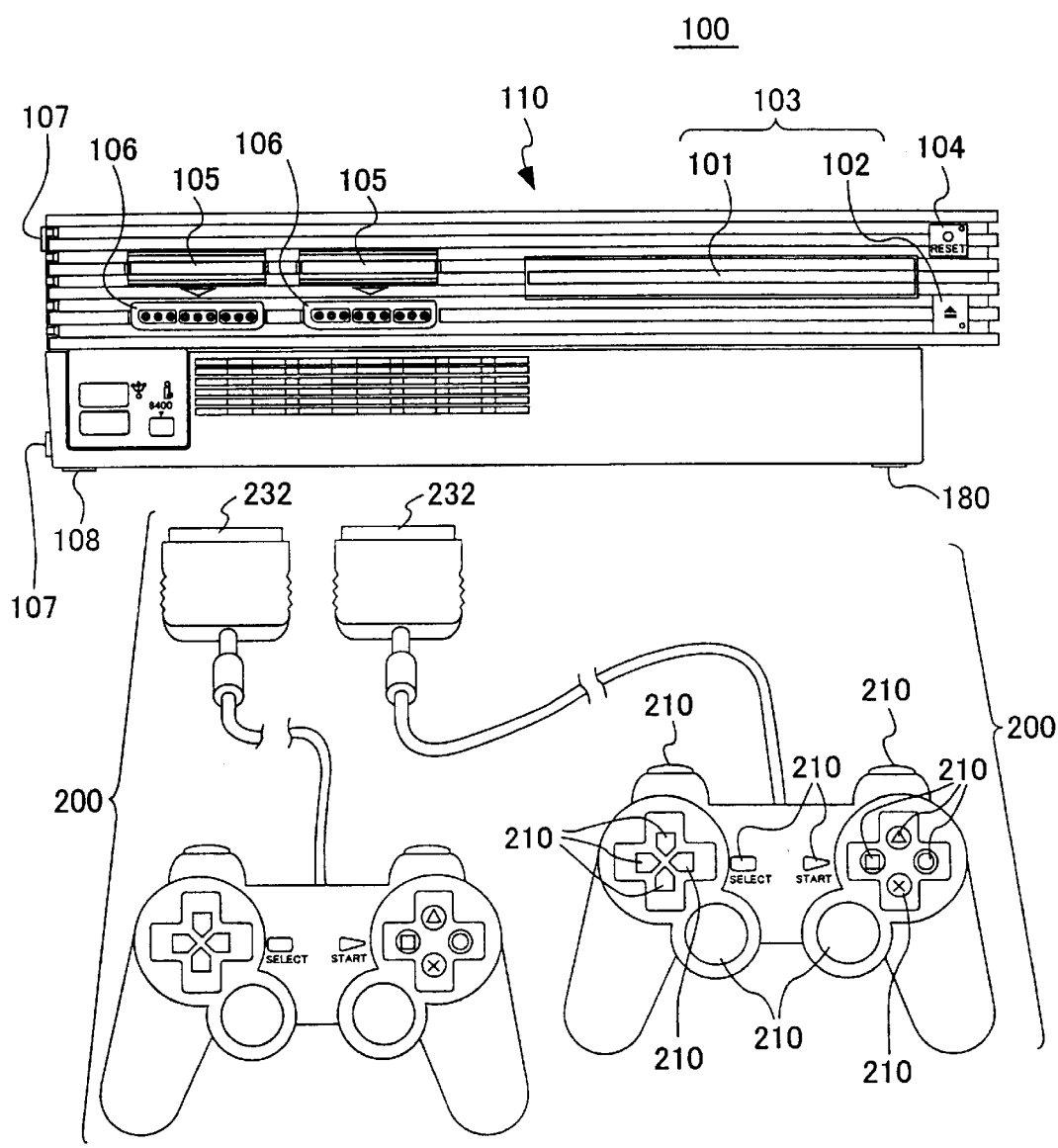
FIG. 6 is a front elevational view of an electronic device 100 with the printed circuit board 50 mounted thereon and a top plan view of an operating unit 200 according to a second embodiment of the present invention.
Figure 7:
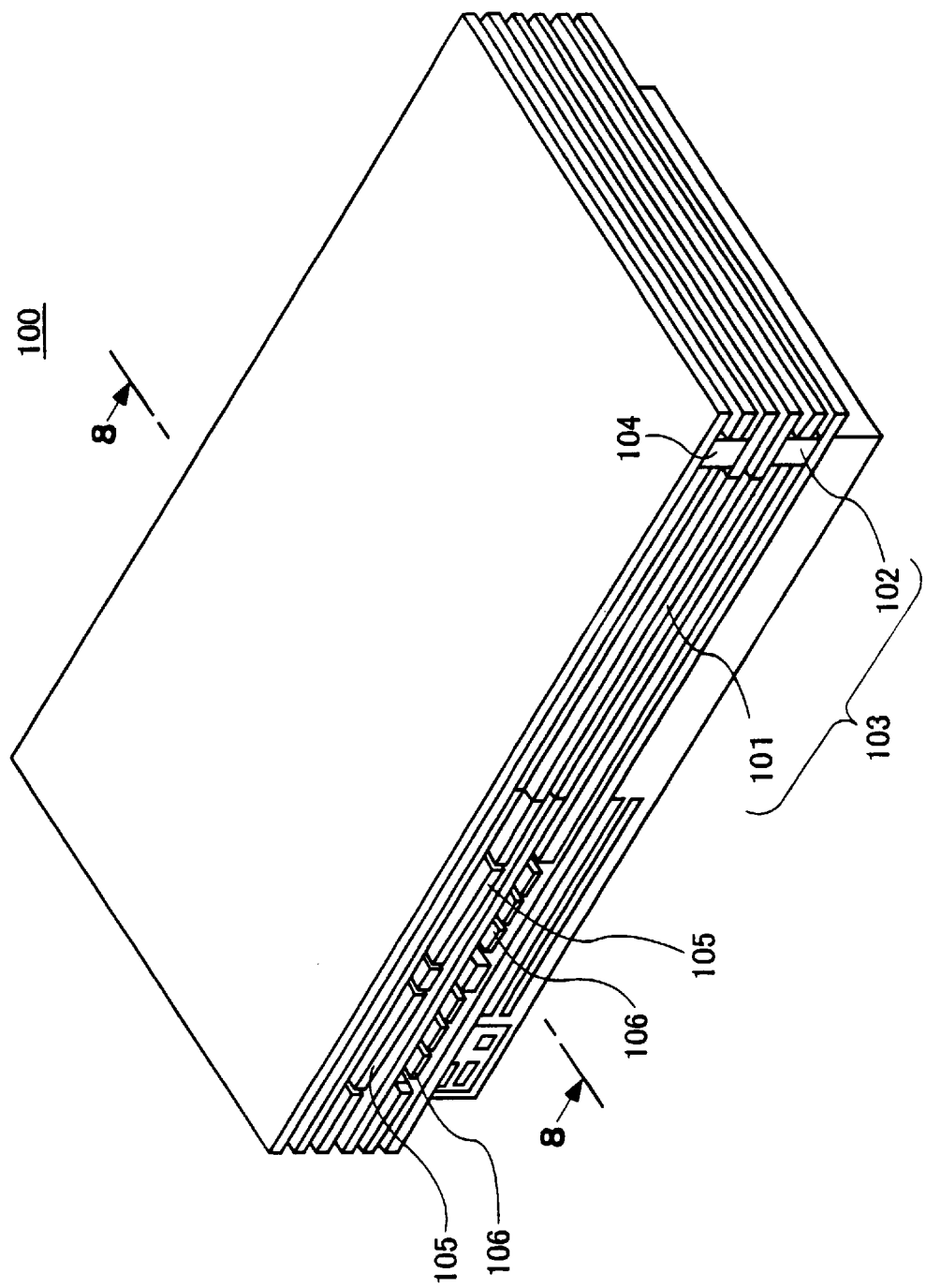
FIG. 7 is a perspective view of the electronic device 100 according to the second embodiment of the present invention.
Figure 8:
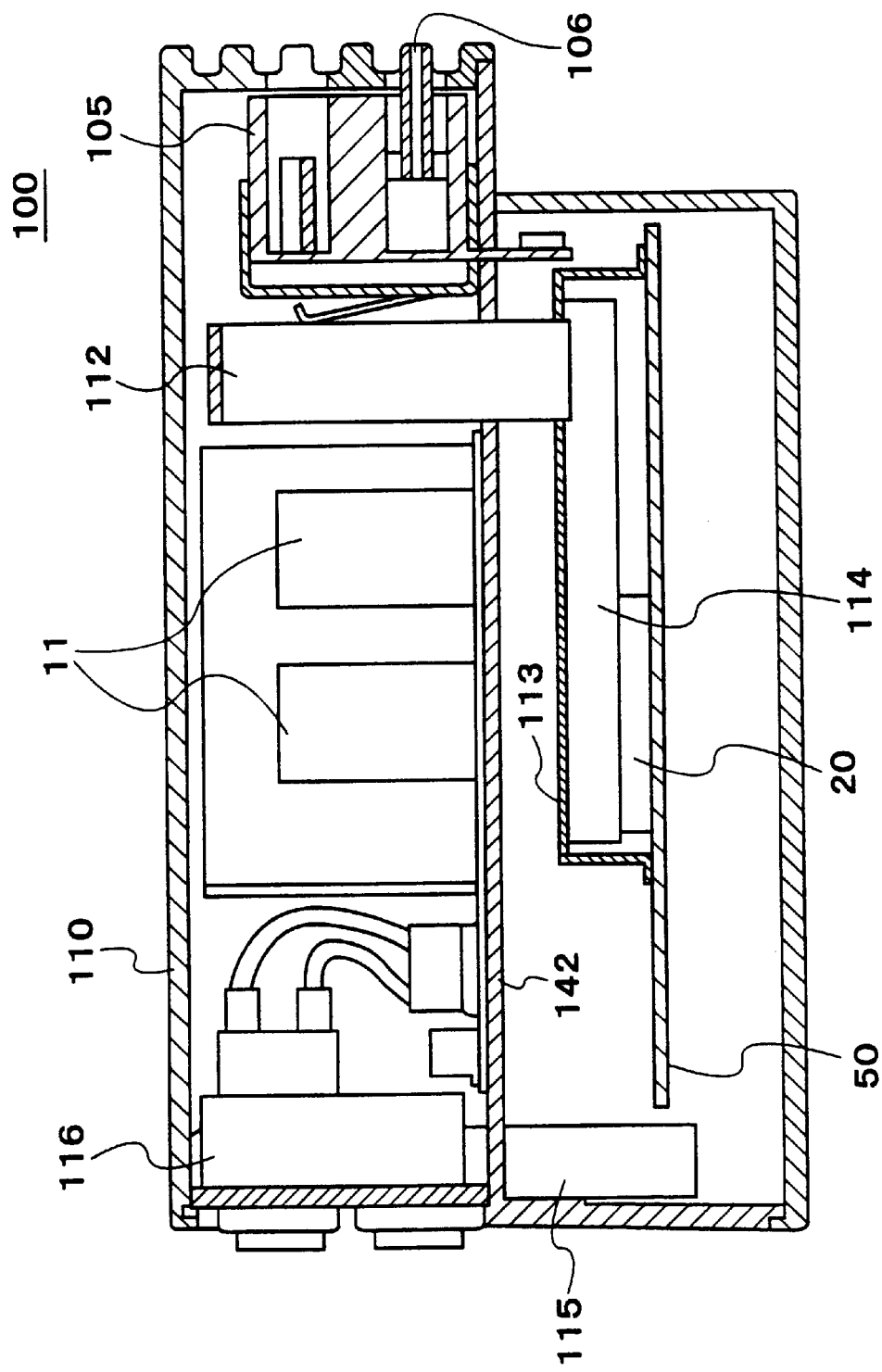
FIG. 8 is a sectional view of the electronic device 100, taken along a line 8—8 of FIG. 7.

The printed circuit board 50 is mounted in a housing 110 of the electronic device 100 as illustrated in FIG. 8. The electronic device 100 is, for example, an entertainment equipment and comprises a disk device 103 for reproducing a CD (Compact Disk) or DVD (Digital Video Disk) and slot units 105 and 106 as illustrated in FIG. 6. The electronic device 100 is connected to an image display unit (not shown). The slot unit 106 is connected to a connector 232 of an operating unit 200. The slot unit 105 is connectable to a small-sized memory device. The housing 110 has a resetting switch 104, an ejecting switch 102 for the disk device 103, and legs 107 and 108 for supporting the housing in a standing position and in the laying down position, respectively.

A main processor of the integrated circuit element 20 functions to display an image (stored in the DVD which has been set on a tray 101 of the disk device 103) on the image display unit or read programs recorded preliminarily on the DVD or CD and instruct the circuit dedicated only for image processing of the integrated circuit element 51 for production of an image according to the programs and display of the produced image on the display unit.

The main processor of the integrated circuit element 20 functions to respond to a user's operation through a switch 210 of the operating unit 200 to instruct the circuit dedicated for image processing of the integrated circuit element 51 to change the image according to the program as mentioned above. By this, the image of the image display unit changes and the user can enjoy entertainment such as a game. The main processor of the integrated circuit element 20 stores, in a memory device, the progress of the game which is loaded in the slot unit 106.

Inside the housing are arranged parts other than the integrated circuit board 50 such as a power unit, a switch-inlet unit 115, etc. A pipe type heat sink 114 is provided above the printed circuit board 50 for releasing heat generated by the integrated circuit element 20 etc. The pipe type heat sink 114 is connected to a heat radiation fin 112. An exhaust fan 115 is provided on the housing 110 for dissipating heat of the radiation fin 112 etc. A shield 113 for protecting the integrated circuit element etc. from external electromagnetic waves is provided for the printed circuit board 50.

The integrated circuit element 20 mounted on the printed circuit board 50 is small device as described done (the first embodiment of the present invention) and contributes to a high mounting efficiency. Therefore, a printed circuit board 50 of a small size is obtained. This in turn enables the entire size of the electronic device 100 to be small. In addition, as the integrated circuit element 20 can be produced at a low cost, the costs of the printed circuit board 50 and the electronic device 100 can be lowered accordingly.

Although the chip 10 is mounted on the printed circuit board 50 in the form of the packaged integrated circuit element 20 in the foregoing embodiments, the chip 10 may be directly bonded on the printed circuit board 50. In this case, the mounting efficiency is further enhanced because the package is not needed. Thus, a more small-sized printed circuit board 50 or electronic device 100 is obtained. Further, the cost can be further reduced due to the fact that the package is not needed and the printed circuit board 50 and the electronic device 100 are a lower price.

The pads 3 of the I/O terminals 2 (for operation) are connected to the printed circuit board 50 through the bonding wires and the leads 12 in the foregoing embodiments, but they may be connected to the printed circuit board 50 through other means such as TAB (Tape-Automated Bonding).

The integrated circuit element 20 of the electronic device 100 is used for controlling complicated operations of a plurality devices such as the disk device 103, operating unit 200, memory unit, image display unit, etc. Therefore, use of the chip according to the first embodiment as the chip 10 of the integrated circuit element 20 for the electronic device 100 will significantly reduce product size and cost.

As described above, according to the present invention, a pad neck problem is solved and an integrated circuit chip having a size suited for its circuit scale can be provided.

Although the invention herein has been described with reference to particular embodiments, it is to be understood

What is claimed is:

1. An integrated circuit element, comprising:

an integrated circuit chip including a substrate having edges defining an inner area, circuit modules located on said substrate, and input/output terminals located on said substrate for inputting and outputting one or more signals to and from said circuit modules;

leads; and a package operable to encapsulate said integrated circuit chip and part of each of said leads;

said input/output terminals including: (i) input/output terminals used for operation which input/output one or more operation signals during operation of said circuit modules, and (ii) input/output terminals used for inspection of said circuit modules;

said input/output terminals used for operation being arranged along said edges of said substrate; and said input/output terminals used for inspection and said circuit modules being arranged on said inner area of said substrate.

2. An integrated circuit element as set forth in claim 1, wherein said input/output terminals used for operation are electrically connected to respective ones of said leads.

3. An integrated circuit element as set forth in claim 2, wherein said input/output terminals used for inspection each have a probe pad for contact with a probe.

4. An integrated circuit element as set forth in claim 2, wherein said input/output terminals used for operation each have a bonding pad which is electrically connected to a respective one of said leads with a bonding wire.

5. An integrated circuit element as set forth in claim 2, wherein said input/output terminals used for operation are arranged in respective rows along said edges of said substrate without a gap between adjacent ones of said input/output terminals.

6. An integrated circuit element as set forth in claim 1, wherein said input/output terminals used for inspection are located at positions inwardly from said input/output terminals used for operation.

7. An integrated circuit element, comprising:

an integrated circuit chip including a substrate having edges defining an inner area, circuit modules located on said substrate, and input/output terminals located on said substrate for inputting and outputting one or more signals to and from said circuit modules;

leads; and a package operable to encapsulate said integrated circuit chip and part of each of said leads;

said input/output terminals including: (i) input/output terminals used for operation which input/output one or more operation signals during operation of said circuit modules, and (ii) input/output terminals used for inspection of said circuit modules, said input/output terminals used for operation being arranged along said edges of said substrate and being electronically connected to respective ones of said leads, said input/output terminals used for inspection and said circuit modules being arranged on said inner area of said substrate such that said input/output terminals used for inspection are not electronically connected to said leads.

8. An integrated circuit element, comprising:

an integrated circuit chip including a substrate having edges defining an inner area, circuit modules located on said substrate, and input/output terminals located on said substrate for inputting and outputting one or more signals to and from said circuit modules;

leads; and a package operable to encapsulate said integrated circuit chip and part of each of said leads;

said input/output terminals including: (i) input/output terminals used for operation which input/output one or more operation signals during operation of said circuit modules, and (ii) input/output terminals used for inspection of said circuit modules, said input/output terminals used for operation being arranged in respective rows along said edges of said substrate without a gap between adjacent ones of said input/output terminals, said input/output terminals used for inspection and said circuit modules being arranged on said inner area of said substrate.

* * * * *